United States Patent
Tang et al.

(10) Patent No.: US 10,879,079 B2
(45) Date of Patent: Dec. 29, 2020

(54) DECAPSULATION OF ELECTRONIC DEVICES

(71) Applicant: JIACO Instruments Holding B.V., Delfgauw (NL)

(72) Inventors: Jiaqi Tang, Delfgauw (NL); Cornelis Ignatius Maria Beenakker, Roosendaal (NL); Willibrordus Gerardus Maria Van Den Hoek, Saratoga, CA (US)

(73) Assignee: JIACO Instruments Holding B.V., Delfgauw (NL)

( * ) Notice: Subject to any disclaimer, the term of this patent is extended or adjusted under 35 U.S.C. 154(b) by 0 days.

(21) Appl. No.: 16/319,504

(22) PCT Filed: Jul. 20, 2017

(86) PCT No.: PCT/NL2017/050491
§ 371 (c)(1),
(2) Date: Jan. 22, 2019

(87) PCT Pub. No.: WO2018/016957
PCT Pub. Date: Jan. 25, 2018

(65) Prior Publication Data
US 2020/0279749 A1    Sep. 3, 2020

(30) Foreign Application Priority Data
Jul. 20, 2016    (NL) ........................... 2017198

(51) Int. Cl.
*H01L 21/311*    (2006.01)
*H01L 21/56*    (2006.01)
(Continued)

(52) U.S. Cl.
CPC ........ *H01L 21/31138* (2013.01); *H01L 21/56* (2013.01); *H01L 21/67126* (2013.01);
(Continued)

(58) Field of Classification Search
None
See application file for complete search history.

(56) References Cited

U.S. PATENT DOCUMENTS

| 5,030,319 A | 7/1991 | Nishino et al. |
| 5,451,263 A * | 9/1995 | Linn ..................... B08B 7/0035 |
| | | 134/1.1 |

(Continued)

FOREIGN PATENT DOCUMENTS

| JP | H06 349801 A | 12/1994 |
| JP | 2006093669 A | 4/2006 |

(Continued)

OTHER PUBLICATIONS

Emmi F et al: "Etching Behavior of an Epoxy Film in 02/CF4 Plasmas", Journal of Vacuum Science and Technology: Part A, AVS /AIP, Melville, NY., US, vol. 9, No. 3 Part 01, May 1, 1991 (May 1, 1991), pp. 786-789, XP000359404, ISSN: 0734-2101, DOI: 10.1116/1.577362 the whole document.

(Continued)

*Primary Examiner* — Allan W. Olsen
(74) *Attorney, Agent, or Firm* — Banner & Witcoff, Ltd.

(57) ABSTRACT

The invention is directed to a method for treating an electronic device that is encapsulated in a plastic package, said method comprising the steps of providing a gas stream comprising a hydrogen source; inducing a hydrogen-containing plasma stream from said gas; and directing the hydrogen-containing plasma stream to the plastic package to etch the plastic package.

24 Claims, 1 Drawing Sheet

(51) Int. Cl.
    *H01L 21/67*     (2006.01)
    *H01L 23/00*     (2006.01)
    *H05K 3/26*     (2006.01)
    *H05K 3/28*     (2006.01)

(52) U.S. Cl.
    CPC ............... *H01L 24/73* (2013.01); *H05K 3/26* (2013.01); *H05K 3/288* (2013.01); *H01L 2224/45147* (2013.01); *H01L 2224/73265* (2013.01); *H05K 2203/0285* (2013.01); *H05K 2203/095* (2013.01)

(56) References Cited

U.S. PATENT DOCUMENTS

| | | |
|---|---|---|
| 2001/0012681 A1 | 8/2001 | Wensel |
| 2004/0206730 A1 | 10/2004 | Holber et al. |
| 2006/0037700 A1 | 2/2006 | Shi et al. |
| 2008/0149273 A1 | 6/2008 | Gomi |
| 2013/0087822 A1* | 4/2013 | Kim .................. H01L 33/54 257/98 |
| 2015/0118855 A1* | 4/2015 | Wagner .................. H01L 21/56 438/715 |
| 2016/0141186 A1 | 5/2016 | Suzuki |
| 2017/0365494 A1* | 12/2017 | Tang .................. H01J 37/32247 |
| 2019/0378944 A1* | 12/2019 | Zhang .................. H01L 31/18 |

FOREIGN PATENT DOCUMENTS

| | | | |
|---|---|---|---|
| JP | 2013 207068 A | 10/2013 | |
| WO | 2013/184000 A1 | 12/2013 | |
| WO | WO-2013184000 A1 * | 12/2013 | ........ H01J 37/32357 |

OTHER PUBLICATIONS

Kerisit Francois et al: "Decapsulation of silver-alloy wire-bonded devices", Proceedings of the 20th IEEE International Symposium on the Physical and Failure Analysis of Integrated Circuits (IPFA), IEEE, Jun. 30, 2014 (Jun. 30, 2014), pp. 102-105, XP032642501, ISSN: 1946-1542, DOI: 10.1109/IPFA.2014.6898187 ISBN: 978-1-4799-1241-4 [retrieved on Sep. 12, 2014] A the whole document.
Matusiewicz et al: "A novel microwave plasma cavity assembly for atomic emission spectrometry", Spectrochimica Acta. Part B: Atomic Spectroscopy, New York, NY, US, US, vol. 47, No. 10, Sep. 1, 1992 (Sep. 1, 1992), pp. 1221-1227, XP026581154, ISSN: 0584-8547, DOI: 10.1016/0584-8547(92)80113-U [retrieved on Sep. 1, 1992] abstract; figures 1,2.

* cited by examiner

DECAPSULATION OF ELECTRONIC DEVICES

RELATED APPLICATIONS

This application is a National Stage Application under 35 U.S.C. 371 of co-pending PCT application PCT/NL2017/050491 designating the United States and filed Jul. 20, 2017; which claims the benefit of NL application number 2017198filed on Jul. 20, 2016 each of which are hereby incorporated by reference in their entireties.

The invention is in the field of electronic devices. More in particular, the invention is directed to the treatment of electronic devices, in particular to decapsulation of semiconductor devices, using a microwave induced plasma, as well as to the apparatus suitable for the treatment and the obtainable treated semiconductor devices.

Electronic devices are routinely decapsulated for failure analysis and quality control. Decapsulation is a process wherein the electronic device (e.g. an integrated circuit or a printed circuit board) that is encapsulated in a package is treated to expose the die and bond wires of the electronic for inspection. It is important that in this process the metal bond wires, metal bond pads, semiconductor die and other components of the electronic device remain as much as possible undamaged, so that further analysis like Optical Microscopy, Scanning Electron Microscopy (SEM), Photo Emission Microscopy, etc. can be performed. If the decapsulation process causes too much damage to any of the parts of the electronic component possible original failure sites could be removed and important information would be lost.

A typical conventional decapsulation method is to use hot nitric and sulfuric acid to etch away the molding compound. Acid etching is fast (several minutes for an electronic package) and works fine with gold wire bonded packages. However, in recent years there has been a switch from gold to copper wire in the electronics industry, which has created a problem for acid decapsulation. Copper wires are more susceptible to be corroded and damaged by the acid than gold wires. As an alternative method, microwave induced plasma (MIP) etching has been developed (see for instance, J. Tang, PhD thesis entitled MIP Plasma Decapsulation of Copper-wired Semiconductor Devices for Failure Analysis, Delft University of Technology 2014; J. Tang et al., *ECS Journal of Solid State Science and Technology*, vol. 1, 2012, p. P175-P178 and J. Tang, et al., In Proceedings of the IEEE 11th International Conference on Electronic Packaging Technology and High Density Packaging, p. 1034-1038, IEEE, Xi'an (2010) which are incorporated herein in their entirety).

Known MIP etching methods are based on microwave-induction of a plasma from a gas stream that comprises argon gas (Ar) as plasma carrier gas, oxygen gas ($O_2$) as plasma etchant gas and optionally a fluorine source (e.g. tetrafluoromethane or $CF_4$) as optional plasma etchant gas. These methods are particularly suitable for etching molding compounds comprising epoxy and silica fillers. The epoxy component is etched away by the oxygen gas and the silica fillers are etched away by the optionally present fluorine atoms and ions. An alternative way is the removal of mold compound material by alternating between an oxygen plasma treatment to remove the epoxy which surrounds the silica particles and ultrasonic cleaning which removes the loose silica particles. Although MIP etching provides good results as compared to the conventional decapsulation methods using acids, further improvement is still required.

It is estimated that currently about 70% of the manufactured electronic wire-bonded devices are based on copper wires. A drawback of copper wire bonding is that the stiffness of copper may lead to fracturing of the bond pad and the die when the die comprises a multitude of interconnected layers (multilayer interconnect). It may therefore be advantageous to use more flexible wiring material, e.g. wiring comprising silver. However, decapsulation of electronic comprising silver bond wires is generally considered to be challenging, even more challenging than decapsulation of electronic devices comprising copper bond wires. A problem with silver bond wires is that silver oxide (and silver fluoride in case $CF_4$ is present in the plasma) may be formed during the known decapsulation methods. Silver fluoride has a low melting point, while silver oxide has a low sublimation point. Both of these properties lead to undesired damaging of the silver bond wires.

For instance, the method described in Kerisit et al. IEEE 21st IPFA (2014) p. 102-105 which involves decapsulation of packages with silver-based alloy wires with a plasma of a 40% $CF_4$ and 60% $O_2$ containing gas mixture, results in damaged silver wires.

Other methods for treating electrical devices include cleaning and/or deflashing. These methods are facing the same challenges as described above for decapsulation.

Surprisingly, it has been found by the present inventors that the above mentioned drawbacks can be overcome, at least in part by using a plasma comprising hydrogen. Such a hydrogen-containing plasma is suitable for treating electronic devices, without undesirably damaging the electronic devices or their bonding wires.

A first aspect of the present invention is therefore a method for treating an electronic device that is encapsulated in a plastic package, said method comprising the steps of
  a) providing a gas stream comprising a hydrogen source;
  b) microwave-inducing a hydrogen-containing plasma stream from said gas with microwaves;
  c) directing the hydrogen-containing plasma stream to the plastic package to etch the plastic package.

Treating the electronic device may comprise at least one of decapsulating, cleaning, deflashing, and the like. The present method may thus advantageously be used in other treatments than decapsulating such as deflashing. Deflashing is the removal of excess plastic package material that for instance remained on the encapsulated electronic device after it was encapsulated in the plastic package. Since the method of the present invention enables fast etching of the plastic package, it is particularly suitable for decapsulating encapsulated electronic devices.

As used herein, the term electronic device or component may include active components, such as semiconductors, including diodes, transistors, integrated circuits, and the like; passive components, such as resistors, capacitors, magnetic (inductive) devices, and the like; as well as combinations of active and passive components, optionally mounted on a substrate, such as on a printed circuit board or a lead frame.

Thus for instance, encapsulated electronic devices typically comprise encapsulated semiconductor devices, encapsulated capacitors, encapsulated inductors, encapsulated resistors, encapsulated printed circuit boards and combinations thereof. The term encapsulated electronic device as used herein comprises electronic devices that are entirely or partially encapsulated, potted, coated, (electrically) insulated and the like in the plastic package. Thus the present method is suitable for treating any electronic device that comprises a plastic package. Plastic packages are known in the art and typically provide protection against impact and corrosion, holds the contact pins or leads which are used to connect from external circuits to the device, and dissipates heat produced in the device.

An apparatus that is particularly suitable for the present invention is a MIP etching apparatus, as described in WO 2013/184000, which is incorporated herein in its entirety. This device is commercially available from Jiaco Instruments B.V. (Delft, the Netherlands). This MIP etching apparatus comprises a Beenakker cavity, also known in the literature as the 'Beenakker-type TM010-mode microwave resonant cavity', as it gives particularly good results.

Hydrogen-containing plasmas are used in other applications. For instance, thin organic polyimide films or photoresist layers of up to 1 μm can be etched away from silicon wafer surfaces (see Robb, *J. Electrochem. Soc.: Solid State Science and Technology* (1984), 1670-1674 and U.S. Pat. No. 4,340,456). The etch rate for this known application is less than 300 Å/min (30 nm/min). This rate may be acceptable for the thin polyimide films, but a higher etch rate (e.g. more than 1 μm/min) is typically required for etching away packages, comprising molding compound in order to expose the die and the bond wires within an acceptable time period. Such packages are normally much thicker, e.g. from 10-1000 μm, typically 50-500 μm. The plastic package of the present invention should thus not be confused with thin insulating layers that are for instance used as intermetal dielectric or passivation layers or as stress relieve layers on silicon wafers or chips.

A particularly preferred etch rate can be obtained by inducing the plasma (step b) and etching away the plastic package under atmospheric pressure. By inducing the plasma and using this under atmospheric pressure, the plasma has a much higher density (in general 1000 times higher) compared to plasma that is induced and used under vacuum (or reduced pressure such as less than 0.05 bar), such that etching away the plastic package may be more efficient.

The plastic package of the electronic device according to the present invention may comprise a conventional molding compound comprising 10-30 wt % organic material. (e.g. epoxy) and 70-90 wt % inorganic material such as silica fillers (e.g. quartz). The plastic package may include other organic polymer materials in various semiconductor packages or dies such as organic polymer die attachments materials, thick (>5 μm) (organic) film over wire materials, die coating materials, silicone materials, redistribution layer materials and the like.

Improved efficiencies may also be achieved at slightly reduced pressures such as 0.5 bar. In a preferred embodiment, steps b and c are therefore carried out at a pressure of 0.05 bar to 1 bar, but preferably at atmospheric pressure.

Plasma etching can be categorized into three categories: ion milling that utilizes physical bombardment of ions such as $Ar^+$; chemical etching by neutral radical such as O' or F'; and reactive ion etching (RIE) that is a combination of both ion milling and chemical etching. For decapsulating it is preferred to use chemical etching to prevent any unwanted damage to the electronic device's die and bond wires. For chemical etching the plasma that reaches the package generally comprise radicals and essentially no ions. This neutral plasma afterglow that reaches the package can be obtained by inducing the plasma under vacuum and transporting the plasma to the package over a long distance (e.g. a long tube or a downstream vacuum chamber) such that the ions exist essentially only at the beginning of the pathway towards the package (where the plasma is induced) due to recombination with the tube/chamber wall as well as with electrons or gas molecules/ions, resulting in the plasma reaching the package located at the end of the pathway being essentially free of ions. Alternatively, the plasma can also be induced under atmospheric pressure such that ions that are induced, recombine with the walls or electrons in the plasma. At atmospheric pressure the density of molecules, atoms radicals and ions is magnitudes higher than in vacuum, the mean free path of ions is much smaller in atmospheric conditions than in vacuum. Thus ions at atmospheric pressure will recombine magnitudes faster than in vacuum. Thus for achieving chemical etching, it is preferred that steps b and c are carried out under atmospheric pressure. As an alternative or in addition to carrying out steps b and c under atmospheric pressure, a Faraday cage may be present around the plasma, so that the ions and electrons are confined inside the Faraday cage, preventing the ions to reach the substrate.

It was found that using the hydrogen-containing plasma may not only be advantageous for electronic devices comprising silver, but that it is in general advantageous for electronic devices comprising copper, silver, gold, palladium, aluminum, tin or alloys thereof. These metals can be present in the bonding wires, the solder balls, the lead frame, the redistribution layer, the surface on which the die is placed and/or the bond pads of the electronic device. The hydrogen-containing plasma results in a milder decapsulation method compared to conventional acid decapsulation or MIP etching using oxygen as etchant gas and thus induces less damage to the electronic device parts. The hydrogen-containing plasma can be induced from gas streams comprising hydrogen gas or hydrocarbon as the hydrogen source. The metastable hydrogen molecules and neutral radical hydrogen (H') can be obtained from hydrogen gas or hydrocarbon via homolysis of the H—H or C—H bond respectively, or by recombination of a $H^+$ with an electron.

When hydrocarbons such as $CH_4$ are used in the present invention, it may in particular be beneficial that the gas stream further comprises some oxygen to avoid carbon deposits in the etching apparatus, e.g. in the microwave cavity or discharge tube.

Without wishing to be bound by theory, the inventors believe that the hydrogen chemically reacts with the plastic package, thereby cleaving C—C bonds to form C—H bonds and subsequently volatile compounds. The chemical etching mechanism may thus be different compared to when oxygen is used as etchant gas and C—O bonds and subsequently $CO_2$ is believed to be formed.

To etch away the package, it is generally also required to actively remove the silica fillers (if present) such that a high etch rate is obtained. To this end, a fluorine source such as tetrafluoromethane may be present in the gas stream. The fluorine source results in fluorine (F'), which reacts readily with the silica fillers, being present in the plasma. Alternatively or additionally to the use of a fluorine source as described above, step c) may be followed by a step d) that comprises subjecting the electronic device to ultrasonic cleaning in a liquid. Said liquid should not undesirably damage the electronic device and may accordingly comprise for instance (deionized) water, an organic solvent, or a combination thereof. The liquid preferably comprises a non-ionic solvents (for example acetone) which does not have the potential to cause corrosion of the metals on the electronic device's parts (e.g. semiconductor die). A particular function of the liquid is to transfer the energy from the ultrasonic bath to the sample, thus releasing the glass beads. It is highly preferable that the liquid does not damage (e.g. corrodes) the electronic device.

When ultrasonic cleaning is used, the ultrasonic cleaning in step d) is typically alternated with the etching of the package by the plasma (effected by steps a-c). In fact, the method typically comprises 5 to 20 cycles of steps a-d when ultrasonic cleaning is used.

Ultrasonic cleaning has been developed previously for oxygen-based plasma etching (see e.g. J. Tang et al., *ECS Journal of Solid State Science and Technology*, vol. 1, 2012, p. P175-P178) and is particularly preferred as an alternative to fluorine-based silica filler removal as it prevents the need for etchant gasses containing a fluorine source and results in less damage to the decapsulated electronic component. It is therefore preferred that the gas stream comprises less than 5 vol %, preferably less than 1 vol %, more preferably essentially no fluorine source such as tetrafluoromethane.

The relative amount of the hydrogen source in the gas stream may vary from 0.1 to 100 vol %. A gas stream essentially consisting of hydrogen gas (e.g. more than 95 vol % hydrogen gas) may be used, but is typically less preferred for safety reasons. Additionally, inducing and sustaining a plasma stream from said gas stream essentially consisting of hydrogen gas is challenging and generally needs to be carried out in vacuum (e.g. pressures less than 0.1 bar). It is therefore preferred that the gas stream comprises 0.1 to 50 vol %, more preferably 0.1 to 20 vol % hydrogen source.

In addition to the hydrogen source, the gas stream may further comprise one or more carrier gasses such as one or more noble gasses and/or nitrogen. Examples of particularly preferred noble gasses are argon and helium. The noble gasses and/or nitrogen aid in sustaining the plasma and reduce the safety hazards associated with typical hydrogen sources such as hydrogen gas and hydrocarbon. The carrier gas aids in sustaining a stable atmospheric pressure plasma. It is preferred that the gas stream comprises more than 95 vol % carrier gas. However, it may also be possible to generate a pure hydrogen gas plasma, in particular if the plasma is generated and maintained under reduced pressure (vacuum).

It was found that an oxygen-containing plasma results in undesired damage to the electronic device, e.g. to the silver or copper bond wires in the electronic device. Therefore, the gas stream preferably comprises less than 5 vol %, more preferably less than 1 vol % oxygen gas. Most preferably, the gas stream is essentially free of oxygen. However, a small amount of oxygen may aid the etching process without negative side effects. Accordingly, essentially free of oxygen typically means an amount of oxygen may be present that does not undesirable damage the electronic device. A typical amount of oxygen may be 10 vol % relative to the amount of the hydrogen gas. In a particular embodiment, the gas stream comprises no oxygen gas.

It was further found that other gasses such as $NH_3$, $NO$, $NO_2$, $NF_3$, $Cl_2$, $HCl$, $CH_3Cl$, $F_2$, $HF$, $CH_3F$, $CH_2F_2$, $CHF_3$, $C_2F_6$, $C_3F_8$, $H_2S$, $SO_2$, $SF_6$ may also damage silver wires. Although $NH_3$ itself may not heavily damage silver wires, it may form the heavily damaging $NO$, $NO_2$, $HNO_3$, in particular in the presence of large amounts of $O_2$. It is thus preferred that the gas stream is essentially free of these other gasses.

In accordance with the present invention, the gas stream may thus essentially consist of hydrogen gas ($H_2$), hydrocarbon gas or vapor (e.g. $CH_4$ $C_2H_6$), nitrogen gas ($N_2$), one or more noble gasses, or combinations thereof. With essentially consisting of is meant that the gas stream comprises more than 90 vol %, preferably more than 95 vol %, more preferably more than 99 vol % of said gasses. Typical gas mixture that are suitable for the present invention are noble gases, in particular argon, neon and/or helium, in combination with hydrogen, hydrocarbon, and combinations thereof, optionally further comprising nitrogen. Examples of such mixtures are: $Ar/H_2$, $He/H_2$, $Ar/CH_4$, $He/CH_4$, $Ar/C_2H_6$, $He/C_2H_6$, $Ar/H_2/CH_4$, $He/H_2/CH_4$, $Ar/H_2/C_2H_6$, $He/H_2/C_2H_6$, $Ar/H_2/N_2$ and $He/H_2/N_2$.

A particularly preferred gas stream is mixture of argon at a flow rate of 1400 sccm with an argon/hydrogen mixture (95/5 vol %) at a flow rate of 400 sccm. These gas compositions are commercially available standard gases. This gas stream has an Ar to $H_2$ ratio of 98.9 vol % to 1.1 vol %.

"Sccm" is a standard term in the field and means standard cubic centimeter per minute flow rate. Standard conditions are normally a temperature of 0° C. and a pressure of 1.01 bar.

The gas stream of the present invention may be a mixture of multiple gas streams. The etching apparatus suitable for the present invention, may for instance be connected to one or more gas sources (e.g. bottles), which gas streams may be combined before entering the apparatus or within the apparatus. Hydrocarbon vapor can for instance be obtained via bubbling the carrier gas stream through a container comprising the hydrocarbon in a liquid state.

Particularly suitable gas mixtures to be used as gas stream are those gas mixtures known as forming gasses and/or protection gasses. Forming gasses are gas mixtures comprising about 5 vol % hydrogen gas and about 95 vol % inert gasses like nitrogen or a noble gas and are typically used by semiconductor device manufacturers during copper wire bonding of the semiconductor device. Protection gasses are gas mixtures comprising about 1~30 vol % hydrogen gas and about 70~99 vol % argon and are typically used during welding process. A semiconductor device manufacturer thus generally already has the infrastructure with forming gas and/or protection gas available. It is therefore particularly advantageous to use forming gas and/or protection gas as this limits the need to set up new infrastructures and systems for the implementation of the present invention. The use of hydrogen-containing gas such as forming gas and/or protection gas for treating electronic devices, preferably for decapsulating semiconductors, is therefore another aspect of the present invention. As an alternative to forming gas comprising 5 vol % hydrogen gas, other commercially available gas mixtures comprising 1 to 30 vol % may also be used for the present invention.

A further aspect of the present invention is a treated electronic device, preferably a decapsulated semiconductor device, comprising one or more components that comprise silver, e.g. silver bond wire, silver plated leadframe and/or silver surface on which the die is placed, that is obtainable by the method for decapsulation according to the invention as described herein above. Said one or more components of the treated electronic device comprise a surface that remains essentially undamaged when the method for decapsulation in accordance with the present invention is carried out. The decapsulated device comprising silver according to the present invention thus comprises a surface that is smoother and less damaged than decapsulated devices comprising silver, for instance showing essentially no or less cracks, pitting or the presence of silver oxide, that are not obtained by the present method but by for instance MIP etching with an oxygen-containing gas stream or conventional acid decapsulation methods.

Another aspect of the present invention is a plasma etching apparatus comprising a plasma discharge tube that comprises an oxygen-free material like aluminum nitride (AlN) or boron nitride (BN) as material suitable for containing the hydrogen-containing plasma. It was found that AlN and BN materials have a particularly high melting point, a good heat conductivity, and are electronic insulator. In addition, their oxygen-free characteristics reduces the undesired effects of oxygen as described herein-above.

The apparatus according to the present invention is preferably a modified version of the MIP etching apparatus as described in WO 2013/184000, which is incorporated in its entirety. Preferably, the apparatus according to the present invention comprises a Beenakker cavity as a plasma source that is connected to the plasma discharge tube with the materials as described above.

Typically, the apparatus according to the present invention comprises a plasma source (e.g. a Beenakker cavity) allows sustained generation of the plasma from the gas stream under atmospheric conditions, obviating the need for vacuum creation components. The plasma source is provided with a plasma discharge tube for discharging the plasma in the form of a plasma jet. The plasma jet is directed toward the electronic device's package surface along a predetermined flow trajectory by means of the discharge tube. The gas supply conduit and plasma discharge tube are connected and the discharge tube extends through the center of the plasma source. This discharge tube comprises the oxygen-free material like aluminum nitride (AlN) or boron nitride (BN), and may have an outer tube diameter of between 2 to 10 mm (e.g. about 6 mm), and inner tube diameter of about 0.5 to 3 mm (e.g. about 1.2 mm). The discharge tube length may be 30 to 150 mm (e.g. about 10 cm). The discharge tube effectively isolates the gas flowing inside the discharge tube which is inside the plasma source from the remaining void enclosed by the hollow structure forming the cavity's resonance chamber.

The present apparatus further typically comprises a sample holder positioned at a substantially perpendicular distance from the plasma discharge tube. The sample holder provides a surface for holding the sample.

For the purpose of clarity and a concise description features are described herein as part of the same or separate embodiments, however, it will be appreciated that the scope of the invention may include embodiments having combinations of all or some of the features described.

The present invention can be illustrated by the following examples.

EXAMPLE 1

Figure 1:
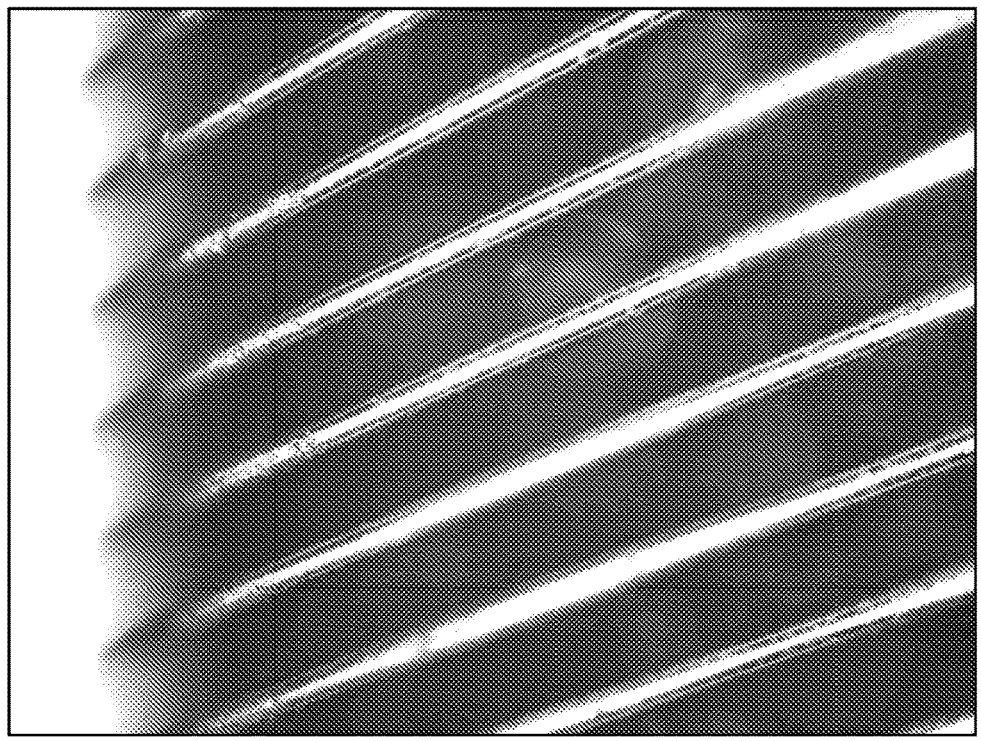
FIG. 1 illustrate a decapsulated semiconductor device comprises silver bond wires in accordance with the present invention.

In a MIP etching apparatus commercially available by Jiaco Instruments B.V. (Delft, the Netherlands) and described in WO 2013/184000, a plasma was induced from gas stream consisting of argon and hydrogen gas (95:5) with a flow rate of 400 sccm using an argon flow of 1400 sccm as the carrier gas. This plasma in combination with ultrasonic cleaning was used to decapsulate a semiconductor device comprising silver bond wires and a plastic package of 10% epoxy and 90% silica fillers. A decapsulated semiconductor device showing a clean wire surface upon visual inspection was obtained (FIG. 1).

EXAMPLE 2

The experiment described in Example 1 was repeated with a gas stream consisting of argon gas, nitrogen gas and hydrogen gas (viz. a mixture of a first stream of argon (100 vol %) at 1400 sccm and a second stream of nitrogen and hydrogen (95 and 5 vol % respectively) at 25 sccm. A decapsulated semiconductor device showing an acceptably clean and slightly damaged silver wire surface upon visual inspection was obtained.

COMPARATIVE EXAMPLES

Figure 2:
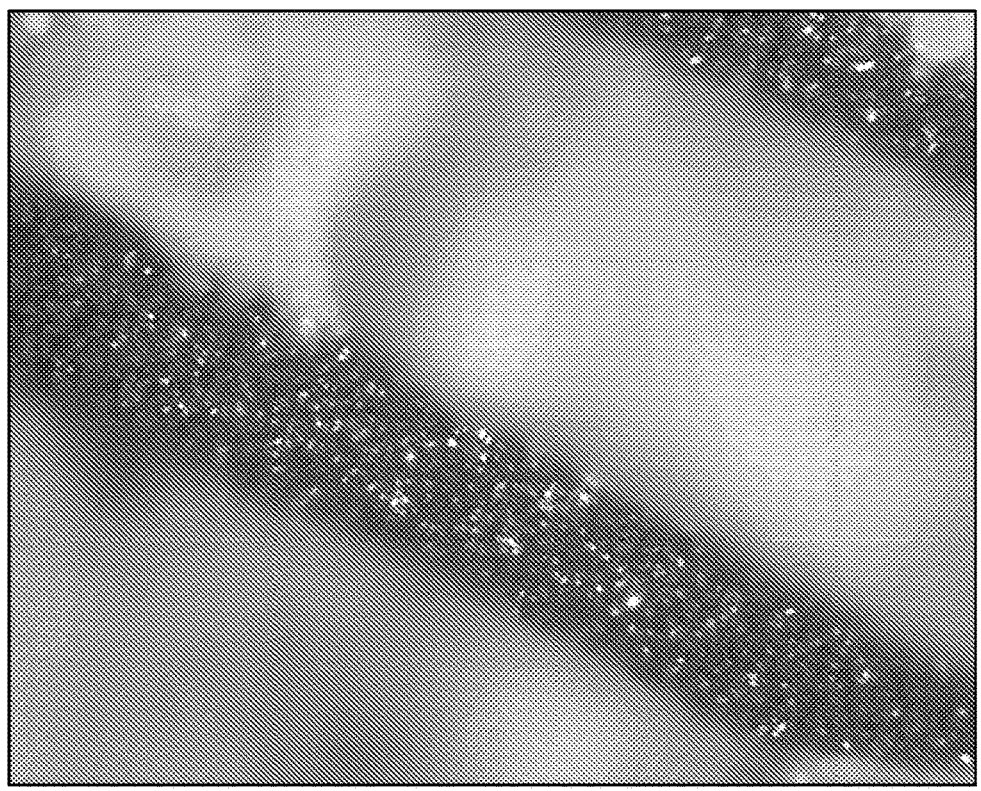
FIG. 2 illustrate comparative decapsulated semiconductor device comprises silver bond wires that are not in accordance with the present invention.

The experiment described in Example 1 was repeated with a gas stream consisting of Ar/$N_2$, Ar/$O_2$ (FIG. 2), $O_2$/$CF_4$ (no ultrasonic cleaning) or decapsulation was achieved using a conventional acid decapsulation method. The results are summarized in table 1.

TABLE 1

| Comparative examples | |
|---|---|
| Etching method | Observations |
| MIP with Ar/$N_2$ | No decapsulation observed. |
| MIP with Ar/$O_2$ | Decapsulation observed, but a severely damaged silver wire with a rough surface was obtained. (FIG. 2) |
| Conventional vacuum plasmas with $O_2$/$CF_4$ | Decapsulation observed, but severely damaged silver wire with a rough surface was obtained. |
| Acid with $HNO_3$/$H_2SO_4$ | Decapsulation observed, but severely damaged silver wire with a rough surface was obtained. |

The invention claimed is:

1. A method for treating an electronic device that is at least partially encapsulated in a plastic package, said method comprising decapsulating and the steps of
   a) providing a gas stream comprising a hydrogen source;
   b) inducing a hydrogen-containing plasma stream from said gas;
   c) directing the hydrogen-containing plasma stream to the plastic package to etch the plastic package;
   wherein treating the electronic device does not comprise cleaning and/or deflashing.

2. The method according to claim 1, wherein the electronic device is at least one of an encapsulated semiconductor device and a printed circuit board.

3. The method according to claim 1, wherein the electronic device comprises copper, silver, gold, palladium, platinum, rhodium, ruthenium, nickel, iridium, aluminum, tin or alloys thereof.

4. The method according to claim 1, wherein the gas stream comprises 0.01 to 100 vol % of the hydrogen source.

5. The method according to claim 1, wherein the hydrogen source is hydrogen and/or hydrocarbon.

6. The method according to claim 1, wherein the gas stream further comprises one or more carrier gasses.

7. The method according to claim 6, wherein the one or more carrier gases comprise one or more noble gasses and/or nitrogen.

8. The method according to claim 1, wherein the gas stream essentially consists of hydrogen gas and/or hydrocarbon and optionally one or more carrier gasses.

9. The method according to claim 1, wherein the gas stream comprises less than 5 vol % oxygen gas and/or less than 5 vol % of a fluorine source.

10. The method according to claim 9, wherein the fluorine source is tetrafluoromethane.

11. The method according to claim 1, wherein the plastic package comprises a molding compound comprising 10-30 wt % organic material, or 70-90 wt % inorganic material.

12. The method according to claim 11, wherein the organic material comprises epoxy.

13. The method according to claim 11, wherein the inorganic material comprises one or more silica fillers, and/or organic polymer die attachment materials, film over wire materials, die coating materials, silicone materials, or redistribution layer materials.

14. The method according to claim 1, wherein step c) is followed by step d) comprising subjecting the electronic device to ultrasonic cleaning in a liquid.

15. The method according to claim 14, comprising 5 to 20 cycles of steps a-d.

16. The method according to claim 14, wherein the liquid comprises deionized water, an organic solvent or a combination thereof.

17. The method according to claim 1, wherein steps b and c are carried out at 0.05 to 1 bar.

18. The method according to claim 1, wherein the electronic device comprises silver or an alloy thereof.

19. The method according to claim 1, wherein the gas stream comprises 0.1 to 50 vol % of the hydrogen source.

20. The method according to claim 1, wherein the gas stream comprises 0.3 to 20 vol % of the hydrogen source.

21. The method according to claim 1, wherein the gas stream comprises 0.5 to 5 vol % of the hydrogen source.

22. The method according to claim 1, wherein the gas stream comprises less than 1 vol % oxygen gas and/or less than 1 vol % of a fluorine source.

23. The method according to claim 22, wherein the fluorine source is tetrafluoromethane.

24. The method according to claim 1, wherein steps b and c are carried out at atmospheric pressure.

* * * * *